(12) United States Patent
Liao

(10) Patent No.: US 7,563,101 B2
(45) Date of Patent: Jul. 21, 2009

(54) ELECTRICAL CONNECTOR HAVING PICK UP CAP

(75) Inventor: Fang-Chu Liao, Tu-cheng (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 12/229,350

(22) Filed: Aug. 21, 2008

(65) Prior Publication Data

US 2009/0053915 A1 Feb. 26, 2009

(30) Foreign Application Priority Data

Aug. 21, 2007 (CN) .................. 2007 2 0045417.5

(51) Int. Cl.
*H01R 13/60* (2006.01)

(52) U.S. Cl. .................. 439/41; 439/135; 439/940

(58) Field of Classification Search .................. 439/41, 439/42, 331, 940, 135
See application file for complete search history.

(56) References Cited

U.S. PATENT DOCUMENTS

| 6,413,111 B1 * | 7/2002 | Pickles et al. ............... 439/342 |
| 6,533,592 B1 * | 3/2003 | Chen et al. .................. 439/135 |
| 6,554,625 B1 * | 4/2003 | Liao et al. .................. 439/135 |
| 6,753,474 B2 | 6/2004 | Trout |
| 2007/0149016 A1 * | 6/2007 | Xu et al. ..................... 439/157 |
| 2007/0202718 A1 * | 8/2007 | Liao ........................... 439/78 |

* cited by examiner

*Primary Examiner*—Hae Moon Hyeon
(74) *Attorney, Agent, or Firm*—Wei Te Chung

(57) ABSTRACT

An electrical connector (1) includes a housing having a window (11) defined through a center of the housing, and a pick up cap (30) having a top surface (301) providing an engagement surface (31) for being sucked by a vacuum pickup device and a bottom surface (302). The window is surrounded by interior walls (113) intersecting at corners (111). The pick up cap has a pair of opposite spring beams (33) integrated with the bottom surface for engaging with interior walls of the window and having a pair of elbowed portions (331) formed on opposite ends of the spring beam, and two pairs of corresponding slots (311) defined through four corners of the pick up cap for providing a clearance to mold the spring beam.

16 Claims, 3 Drawing Sheets

ELECTRICAL CONNECTOR HAVING PICK UP CAP

BACKGROUND OF THE INVENTION

1. Field of the Invention

The present invention is directed to an electrical connector, and particularly to an electrical connector having an improved pick up cap for transporting the electrical connector, such as to a printed circuit board (PCB) during assembly.

2. Description of Prior Arts

Many types of electrical connector exist today. The electrical connector is typically mounted to a circuit board through an automated process. The automated assembly processes have used a vacuum pickup device to form a vacuum seal with a pick up cap of the electrical connector and to transport the electrical connector to the circuit board.

U.S. Pat. No. 6,753,474 issued on Jun. 22, 2004 discloses such an electrical connector for mounting to a PCB. The electrical connector includes a base defining a window which is surrounded by interior walls intersecting at corners, a pick up cap located onto the window of the base. The pick up cap has a pair of slots defined on opposite sides thereof and corresponding spring arms located above the slots and extending into the window for resisting against the interior walls. The base provides a definite circular surface between the pair of slots in order that the vacuum pickup device may form a seal on the transport and facilitate transport of the electrical connector to the PCB.

In operation, it is difficult to form a vacuum seal on the area of the pair of the slots because the area is rigidly limited by the opposite slots.

Hence, it is desirable to provide an improved electrical connector to overcome the aforementioned disadvantages.

SUMMARY OF THE INVENTION

An object of the present invention is to provide an electrical connector having a pick up cap for providing a sufficient surface for forming a vacuum seal on the surface.

To achieve the above object, an electrical connector comprises a housing having a window defined through a center of the housing, and a pick up cap connected to the housing and having a top surface providing an engagement surface for being sucked by a vacuum pickup device and a bottom surface. The window is surrounded by interior walls intersecting at corners. The pick up cap comprises a pair of opposite spring beams integrated with the bottom surface for engaging with interior walls of the window and having a pair of elbowed portions formed on opposite ends of the spring beam, and two pairs of corresponding slots defined through four corners of the pick up cap for providing a clearance to mold the spring beam.

Advantages of the present invention are to provide a pick up cap providing an engagement surface between the pairs of opposite slots which are providing clearances to mold the spring beams. The semidiameter of the engagement surface is sufficient to form a vacuum seal by a vacuum pickup device on the surface.

Other objects, advantages and novel features of the invention will become more apparent from the following detailed description of the present embodiment when taken in conjunction with the accompanying drawings.

DETAILED DESCRIPTION OF THE PREFERRED EMBODIMENT

Figure 1:
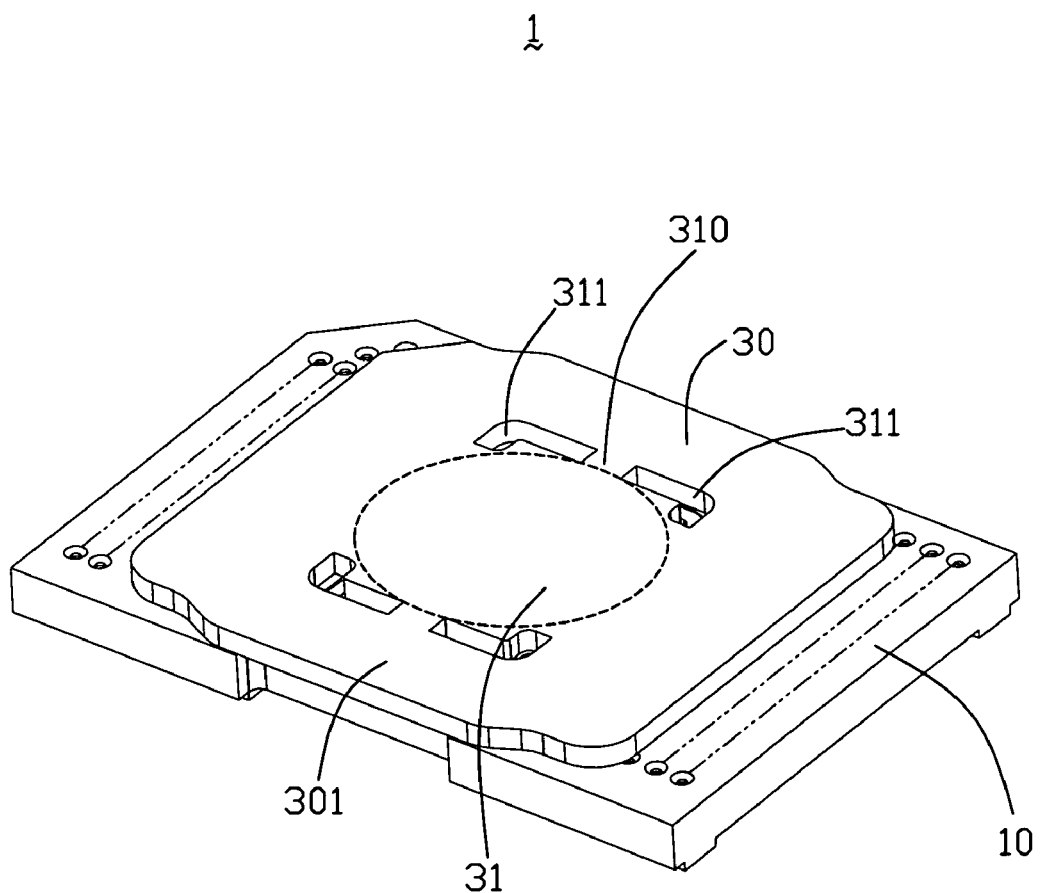
FIG. 1 is a perspective view of an electrical connector of the present invention.
Figure 2:
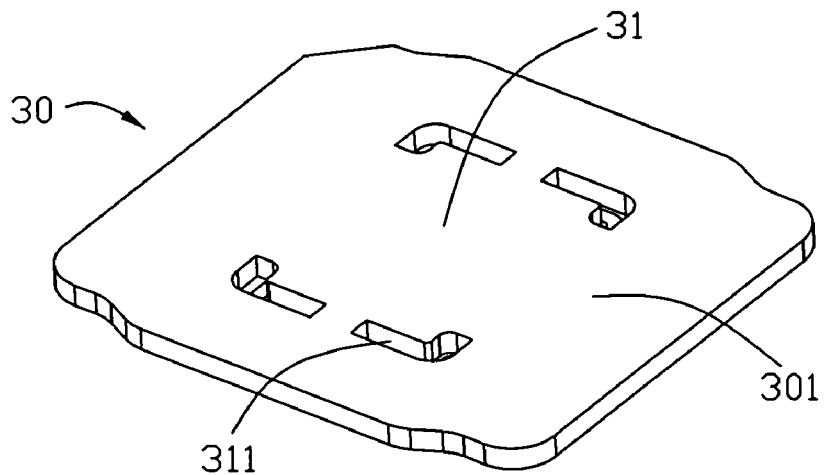
FIG. 2 is an exploded view of the electrical connector as shown in FIG. 1.
Figure 2:
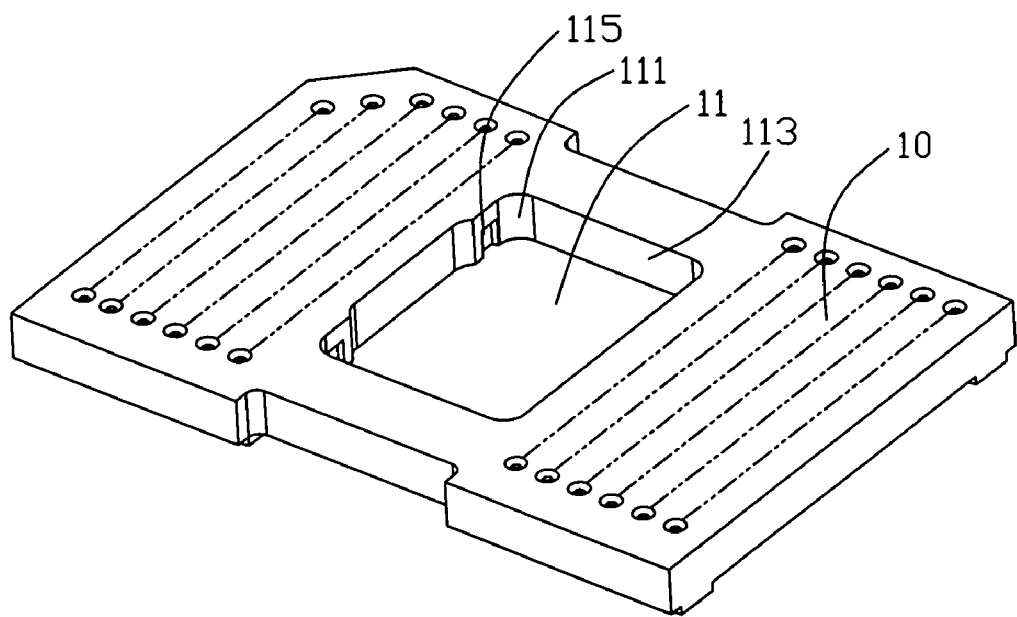
Figure 3:
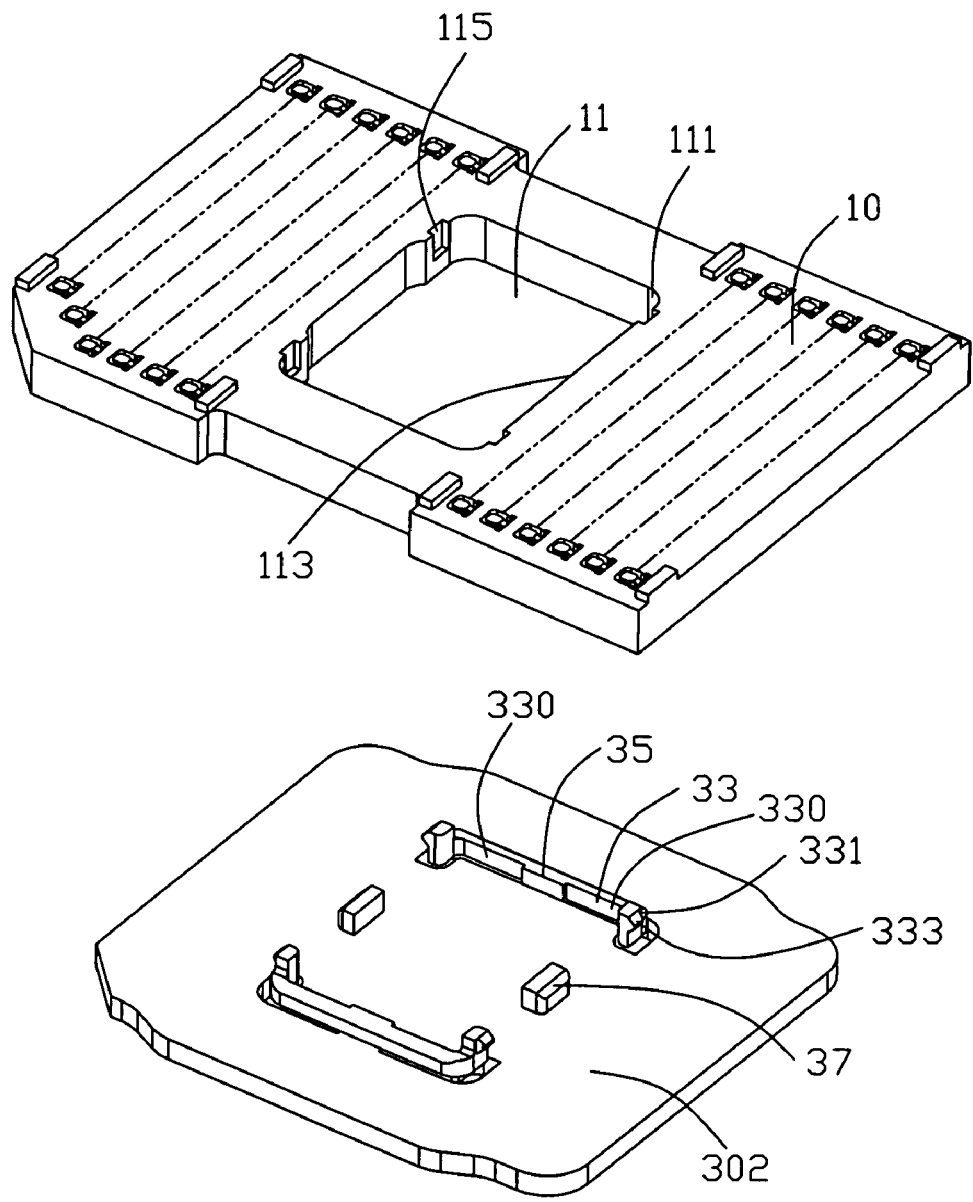
FIG. 3 is an exploded view of the electrical connector as shown in FIG. 2, taken from another aspect.

Reference will now be made to the drawing figures to describe the present invention in detail. Referring to FIGS. 1-3, an electrical connector 1 for mounting to a PCB (not shown) having a housing 10 and a pick up cap 30 assembled onto the housing 10. The electrical connector 1 referred in this embodiment is a Land grid array connector.

Referring to FIGS. 2 and 3, the housing 10 has a plurality of pins (not labeled) assembled therein and a window 11 defined through a center thereof. The window 11 is of rectangular configuration and surrounded by interior walls 113 intersecting at corners 111.

Referring to FIG. 2, the pick up cap 30 includes a top surface 301 providing an engagement surface 31 for mating with a vacuum pickup device (not shown) forming a vacuum seal on the engagement surface 31 and a bottom surface 302. The pick up cap 30 comprises a pair of opposite spring beams 33 for engaging with the interior walls 113 of the window 11, and two pairs of corresponding L-shaped slots 311 defined through four corners of the pick up cap 30 for providing a clearance to mold the spring beam 33.

The spring beam 33 comprises a flexible strip 35 extending from the bottom surface 302 of the pick up cap 30, a pair of spaced arms 330 extending from opposite ends of the flexible strip 35 and cantilevered above corresponding slot 311, and two elbowed portion 331 respectively bending from the spaced arm 330 to form an elbow. The flexible strip 35 of the spring beam 33 extends downwardly from the bottom surface of a medial portion 310 positioned between the two slots 311. The elbowed portion 331 comprises a locking protrusion 333 extending outwardly from the exterior side surface of the elbowed portion 331 for abutting against a recess 115 defined on the interior wall 113 of the window 11.

The pick up cap 30 further comprises a pair of opposite posts 37 respectively protruding downwardly from the bottom surface 302 of the pick up cap 30 and located between the pair of opposite spring beams 33 for interfering with corresponding interior walls 113 of the window 11 to thereby restricting relative horizontal movement of the pick un cap 30 with regard to the housing 10. In this preferred embodiment, as can be readily seen from FIG. 3, root section (not labeled) of the pair of the spring beams 33 and the pair of posts 37 cooperate respectively with the interior walls 113 of the center window 11 so as to avoid undesired movement of the pick up cap 30 with respect to the housing 10.

When the pick up cap 30 is inserted into the clearance of the window of the housing 10, the locking protrusion 333 of the spring beam 33 firmly resist against the recess 115 of the interior wall 113, and the posts 37 interfere with corresponding interior wall 113 of the window 11. In automated assembly processes, a vacuum pickup device is used to form a vacuum seal on the engagement surface 31 of the pick up cap 30 and to transport the electrical connector 1 to the PCB.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An electrical connector, comprising:
   a housing having a window defined through a center thereof, the window being surrounded by interior walls intersecting at corners;
   a pick up cap connected to the housing and having a top surface providing an engagement surface for being sucked by a vacuum pickup device, a bottom surface, a pair of opposite spring beams integrated with the bottom surface for engaging with interior walls of the window and respectively having a pair of elbowed portions formed on opposite ends of the spring beam, and two pairs of corresponding slots defined through the pick up cap.

2. The electrical connector as claimed in claim 1, each spring beam comprises a flexible strip extending from the bottom surface of the pick up cap, a pair of spaced arms extending from opposite ends of the flexible snip and cantilevered above corresponding slot, from which said elbowed portions are respectively bent.

3. The electrical connector as claimed in claim 2, wherein said pick up cap comprises a metal portion positioned between the two slots, and wherein the flexible strip of the spring beam extends downwardly from the bottom surface of the medial portion.

4. The electrical connector as claimed in claim 2, wherein said elbowed portion comprises a locking protrusion extending outwardly from an exterior side surface of the elbowed portion for abutting against a recess defined on the interior wall of the window.

5. The electrical connector as claimed in claim 1, wherein said pick up cap comprises a pair of opposite posts respectively protruding downwardly from the bottom surface of the pick up cap for interfering with corresponding interior wall of the window.

6. The electrical connector as claimed in claim 1, wherein each slot is L-shape.

7. An electrical connector assembly comprising:
   a flat type insulative housing defining a center opening extending therethrough in a vertical direction;
   a plurality of contacts disposed by two sides of the opening;
   a plurality of downward shoulders formed on the housing along periphery of the opening; and
   a pick up cap including a main body with an upward flat surface thereon, a plurality of resilient arms unitarily formed under said main body;
   wherein each of said resilient arms includes a root section upwardly linked to an undersurface of the main body, an arm section essentially horizontally extending from the root section along periphery, and a locking section downwardly extending from a distal end of the arm section with a distance thereof and with thereon a locking head located below the arm section and latched to the corresponding downward shoulder; wherein the arm section and the corresponding locking section of each resilient arm commonly define an L-shaped configuration in a side view.

8. The electrical connector assembly as claimed in claim 7, wherein the arm section and the corresponding locking section of each resilient arm commonly define another L-shape configuration in a top view.

9. The electrical connector assembly as claimed in claim 8, wherein the main body of the pick up cap defines therein a plurality of L-shaped through slots in compliance with the corresponding resilient arms for injection molding consideration.

10. The electrical connector assembly as claimed in claim 7, wherein a plurality of downwardly protrusions are formed on an undersurface of the main body to engage the housing along the periphery for restricting relative horizontal movement of the pick up cap with regard to the housing.

11. The electrical connector assembly as claimed in claim 7, wherein said resilient arms are fully located within a contour of the main body for protection consideration.

12. The electrical connector assembly as claimed in claim 7, wherein the arm section is deflected in a first direction while the locking section with the locking head thereof is deflected in a second direction perpendicular to said first direction.

13. An electrical connector assembly comprising:
   a flat type insulative housing defining a center opening extending therethrough in a vertical direction;
   a plurality of contacts received in the housing;
   a plurality of shoulders formed on inside faces of the opening; and
   a pick-up cap including a main body with an upper flat surface thereon, and
   a plurality of L-shaped resilient arm unitarily formed under the main body, each L-shaped resilient arm having a root section connected to the main body, an arm section extending from the root section along a first inside face of the opening and a locking section extending from a distal end of the arm section along a second inside face which is adjacent to and perpendicular to the first inside face, each locking section having a locking head latched to the corresponding shoulder.

14. The electrical connector assembly as claimed in claim 13, wherein said locking head is located a first level below a second level at which the arm section extends.

15. The electrical connector assembly as claimed in claim 13, wherein the pick-up cap defines a plurality of L-shaped slots located adjacent to corresponding L-shaped resilient arms.

16. The electrical connector assembly as claimed in claim 13, wherein the arm section is deflected in a first direction while the locking section with the locking head thereof is deflected in a second direction perpendicular to said first direction.

* * * * *